United States Patent [19]

Cathey, Jr.

[11] Patent Number: 5,302,241

[45] Date of Patent: Apr. 12, 1994

[54] POST ETCHING TREATMENT OF SEMICONDUCTOR DEVICES

[75] Inventor: David A. Cathey, Jr., Boise, Id.

[73] Assignee: Micron Technology, Inc., Boise, Id.

[21] Appl. No.: 996,479

[22] Filed: Dec. 23, 1992

Related U.S. Application Data

[63] Continuation of Ser. No. 658,183, Feb. 20, 1991, abandoned.

[51] Int. Cl.$^5$ ............................................. H01L 21/00
[52] U.S. Cl. .................................. 156/664; 156/662; 156/666; 156/665; 156/643; 156/646
[58] Field of Search ............... 156/643, 646, 656, 664, 156/665, 666

[56] References Cited

U.S. PATENT DOCUMENTS

| | | | |
|---|---|---|---|
| 4,325,984 | 4/1982 | Galfo et al. | 156/665 |
| 4,505,782 | 3/1985 | Jacob et al. | 156/643 |
| 4,581,101 | 4/1986 | Lenoue et al. | 156/643 |
| 4,592,800 | 6/1986 | Landau et al. | 156/665 |
| 4,734,157 | 3/1988 | Carbaugh et al. | 156/643 |
| 4,985,113 | 1/1991 | Fujimoto et al. | 156/643 |

*Primary Examiner*—Brian E. Hearn
*Assistant Examiner*—George Goudreau
*Attorney, Agent, or Firm*—Michael W. Starkweather

[57] ABSTRACT

According to the process of this invention, after the etching of a semiconductor device in an etching area is completed a reactive chemical composition is typically formed on the semiconductor device. Prior to removing the etched semiconductor from the etching area, a passivating agent comprising silicon tetrafluoride is introduced into the etching area. The passivating agent reacts with any reactive chemical compound associated with the semiconductor to inhibit corrosion of the semiconductor device. The inhibited reactive chemical composition, which is typically in the gas phase, is then pumpable out of the etch area. The inhibited reactive chemical composition is substantially unreactive with and does not post-etch the semiconductor device as is the case with the reactive chemical composition per se. Furthermore, the parametric properties and the threshold voltage which were altered by the prior art dry etch process are not changed by the use of the subject post etching process.

1 Claim, 2 Drawing Sheets

POST ETCHING TREATMENT OF SEMICONDUCTOR DEVICES

BACKGROUND OF THE INVENTION

This patent is a continuation of U.S. Ser. No. 07/658,183, which was filed on Feb. 20, 1991; and is now abandoned.

This invention relates to a process for post etching treatment of semiconductor devices, and more particularly to a process for the post etching treatment of multi-layer semiconductor devices, such as semiconductor devices including metal-containing layers.

It is known in the prior art that the manufacture of multi-layer semiconductor devices typically involves patterned etching using liquid or wet etching materials, such halogens or halogen-containing compounds, of certain layers which comprise features these devices. For example, one well known etching material is chlorine which can exist in the etching process as either chlorine gas or HCl, etc. Chlorine etches the semiconductor isotropically, i.e., in both a lateral and vertical direction. This results in an etched feature which has a line width which is smaller than the resist image.

Etching can also be conducted in a gas phase using known techniques such as plasma etching, ion beam etching, and reactive ion etching. The use of gas plasma technology provides substantially anisotropic etching using gaseous ions, typically generated by an RF discharge. In gas plasma etching the requisite portion of the surface to be etched is removed by a chemical reaction between the gaseous ions and the subject surface. In the anisotropic process, etching takes place only or primarily in the vertical direction so that feature widths substantially match the photoresist pattern widths. U.S. Pat. No. 4,734,157 an elemental silicon-containing layer, such as a layer of polysilicon or silicide, is etched anisotropically employing a gas plasma comprising a gaseous chlorofluorocarbon, capable of supplying $CF_x$ and chlorine ions, and ammonia.

In the semiconductor industry, metal alloys which are subjected to the etching process include aluminum, silicon, copper, tungsten and titanium in varying proportions. These metal layers are sensitive to "corrosion", i.e., chemical attack which post-etches the metal. For example, in the dry etching with a chlorine- or bromine-containing material of a semiconductor device having aluminum or an aluminum alloy, corrosion is a problem. The basic reaction that occurs during the etching process, for instance between chlorine- or bromine-containing compound such as chlorine or HCl plasma, and aluminum to form an aluminum trihalide, such as aluminum trichloride ($AlCl_3$). For example, chlorine and aluminum typically react spontaneously. During this process, chlorine adheres to the photoresist and is adsorbed into the surface of the aluminum. This causes chlorine residues to become associated with the semiconductor device which is under vacuum. When the semiconductor device including the associated chlorine is removed from the vacuum environment, and is moved into the air which contains water moisture, a reaction typically occurs between the chlorine and the metallic component of the semiconductor device. For instance, if aluminum is one of the metals in the semiconductor device structure, $AlCl_3$ will be formed in situ. Materials such as $AlCl_3$ are hygroscopic, and pick up the moisture in the air quite readily. This, in turn, initiates the corrosion process.

One conventional manner of inhibiting the corrosion process is the use of a reactive passivation scheme, which entails introducing into the etching scheme compounds such as $CF_4$ or $O_2$ or a combination thereof. These fluorine and/or oxygen-containing compounds chemically react with the layer of photoresist and remove the unwanted associated chlorine. The chlorine is replaced with fluorine, the fluorine and oxygen together reacting with the metal surface and forming a self-protecting outer layer. During the CF4/O2 plasma passivation, any exposed $SiO_2$, Si, SiN or barrier metal will be chemically attacked resulting in structural defects or disconnected areas in the semiconnector device.

Therefore, a need exists for a process for post etching a semiconductor device which substantially eliminates the above-described problems while maintaining the requisite electrical parametrics, and structural integrity of all the exposed materials.

SUMMARY OF THE INVENTION

The semiconductor device etching process of the present invention meets the above-described existing needs by eliminating the above-described post-etch or corrosion problem, while at the same time maintaining the requisite electrical parametrics, and structural integrity of the exposed materials which form the semiconductor device.

Regarding the process of the present invention, an unetched semiconductor device having a plurality of layers, typically including at least one metal-containing layer, is first introduced into an area for purposes of etching the device. The etching area is generally a vacuum chamber or the like. Although these semiconductor devices are subject to corrosion after completion of the etching operation and removal from the etching area, as previously described, this problem can be substantially eliminated by employing the post etching process of the subject invention. The semiconductor device is etched in said etching area with an etchant material to form a predetermined etched pattern therein. The etchant material typically is a halogen-containing material, preferably a chorine-containing material. The etchant material generally includes a chemical etchant composition which reacts with at least one of said layers of said semiconductor device to produce a reactive chemical compound composition which is associated with the semiconductor device. This reactive composition will cause corrosion of at least one of the exposed layers of the etched semiconductor device when the etched semiconductor device is removed from said etching area. For purposes of illustration, the previously described dry etching of a semiconductor device having an aluminum or aluminum alloy layer can be modified according to the teachings of the present invention. Various known materials can be employed as the chemical etchant composition. Many of these materials, such as chlorine gas or HCl, is known to cause corrosion in the above-described types of semiconductor devices when they are removed from the etching area. As before, for example, when chlorine interacts with aluminum in at least one of the semiconductor layers, a reaction occurs to form $AlCl_3$. The chlorine reactive chemical compound produced is adsorbed into the surface of the aluminum.

According to the process of this invention, prior to removing the etched semiconductor from the etching area, a silicon tetrafluoride (SiF$_4$) passivating agent is introduced into the etching area. Alternatively, the passivation process can be conducted in a separate passivating area, i.e., such as a second chamber. Preferably, the passivating area is phyically attached to form a two compartment closed system. Thus, after the etching operation is completed, the etched semiconductor device is introduced into the separate passivating area. Then a passivating agent comprising a gaseous SiF$_4$ plasma is introduced into the separate passivating area. The SiF$_4$ passivating agent has a very low etch rate on silicon or silicon dioxide substrates. The passivating agent is substantially unreactive with and does not post-etch the semiconductor device as is the case with chlorine per se. Instead, it forms an inhibited reactive chemical compound by replacing the chlorinated products in sidewall passivation and then removing same from the etching area. This inhibited reactive chemical compound adheres to the exposed metal surface and on the oxide underlayer without adversely attacking same, thereby inhibiting corrosion of the semiconductor device. In cases where the semiconductor device includes an outer photoresist layer, the photoresist layer can be removed from said semiconductor device before or after the passivation process is conducted.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
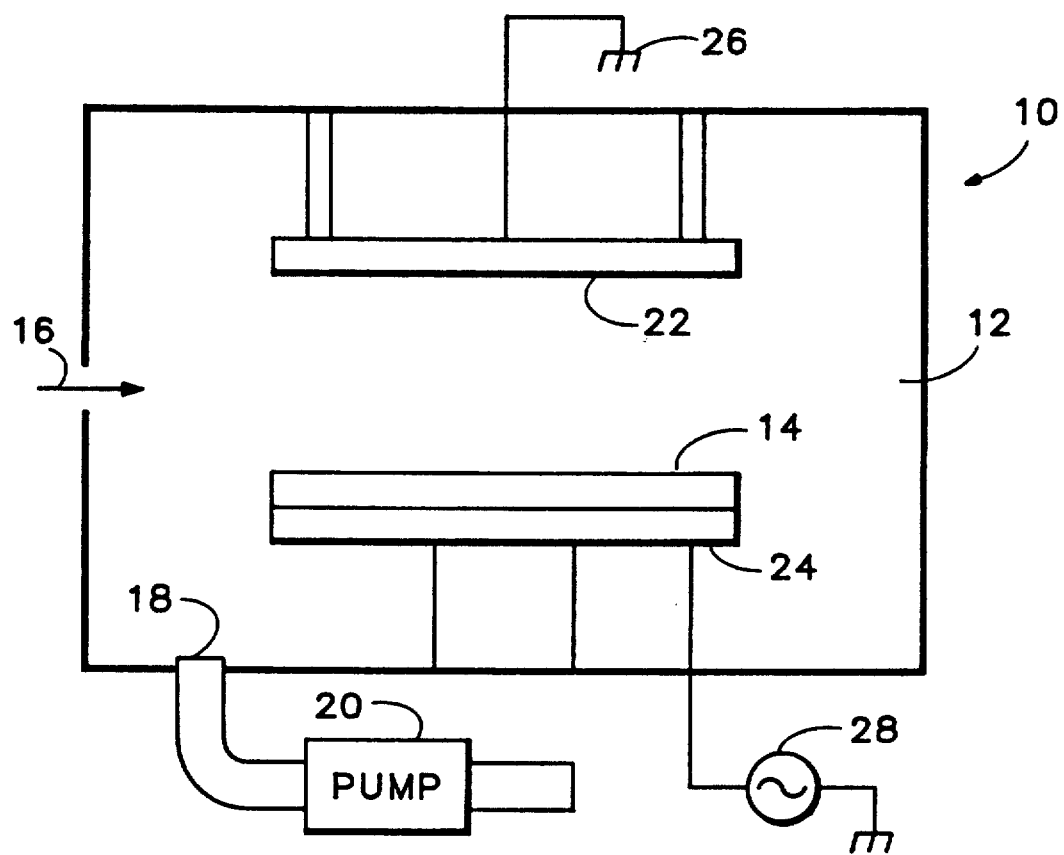
FIG. 1 is a pictorial representation of a single compartment vacuum system for conducting both dry etching and the non-reactive passivation process of the present invention.

A process described in this invention is for etching a semiconductor device in an etching area to form a predetermined etched pattern therein. The process comprises providing a semiconductor device having a plurality of layers. At least one of these layers of the semiconductor device typically comprises a metal-containing material. Preferably, the semiconductor device has a metal content of at least about 80% by weight of the total weight of the metal-containing layer. More preferably, at least one of the metal-containing layers of the semiconductor has a the metal-containing material of the metal-containing metal content of at least about 90% by weight. As for layer, it is generally selected from a group consisting of aluminum, titanium, tungsten, copper and aluminum alloys. The aluminum alloys typically include aluminum in combination with any one or all of titanium, copper and silicon.

The semiconductor device is then etched with an etchant material to form a predetermined pattern therein. The etchant material comprises a chemical etchant composition. The chemical etchant composition is preferably a bromine- or chlorine-containing material. Examples of chemical etchant compositions which can be employed in this invention are as follows: a chlorine-containing etchant system such as chlorine-chloroform-nitrogen-boron trichloride, or chlorine-silicon tetrachloride-chloroform-nitrogen, or chlorine-silicon tetrachloride-boron trichloride-nitrogen. The chemical etchant composition reacts with at least one of the layers of the semiconductor device to produce a reactive chemical compound composition which becomes associated with the semiconductor device. Under normal circumstances, the reactive chemical compound produced will cause corrosion of at least one of the layers of the etched semiconductor device when the etched semiconductor device is maintained at a high vapor pressure which can be readily removed from the etching area. Preferably, the working area is a vacuum chamber which is maintained at from about 0 up to about 1 torr.

The etchant material can also include a coating composition comprising a silicon-containing compound. The coating material is deposited onto the entire outer surface of the semiconductor, but is removed from the horizontal surfaces during the etching operation. The coating material also protects the upright surfaces from undercutting by the etchant composition.

In order to avoid the above unwanted results, the etched semiconductor device is post treated with a passivating agent. The passivating agent is added to etching area, after the etching process is substantially completed, and it reacts with the reactive chemical compound prior to removal of the finished semiconductor device from the etching area. The passivating agent is chosen so that it does not substantially react with the semiconductor device by forming harmful acids upon exposure to the atmosphere, usually containing moisture. Preferably, the passivating agent is silicon tetrafluoride which is more reactive than chloride or bromine, and thus will replace those chemicals found in and on the semiconductor device layers after the etching process. The passivating agent inhibits the corrosion of semiconductor device caused by the presence of the reactive chemical compound. In this way, the inhibited reactive chemical compound does not substantially corrode the semiconductor device.

The inhibited reactive chemical compound is preferably a high vapor pressure gas which is readily removed from the etching area. For instance, as shown in FIG. 1, a typical gas plasma etching system 10 for both etching and passivating a semiconductor device 14 is pictorially depicted. The gas plasma etching system 10 includes a gas plasma etching chamber 12 in which a semiconductor device 14 is introduced. An etchant gas can then be introduced into etching chamber 12 through a gas inlet, described by directional arrow 16, for use in the gas plasma etching of the semiconductor device 14. After the etching operation is completed, the etchant gas is removed via the exhaust system 18. Exhaust system 18 includes an exhaust pump 20. Semiconductor device 14 is located between upper and lower plasma etching electrode plates 22 and 24, respectively. The upper plate 22 is grounded by a conventional grounding device 26. The lower plate 24 is connected to an RF Generator 28 which, under the influence of vacuum, creates a gas plasma material from the etchant gas. It is this gas plasma material which isotropically etches semiconductor device 14 forming a reactive chemical compound. After the etching operation is completed, a passivating gas, such as gaseous silicon tetrafluoride under plasma conditions, is introduced into the etching chamber 12 thru inlet 16 where it reacts with the reactive chemical compound to inhibit same.

Figure 2:
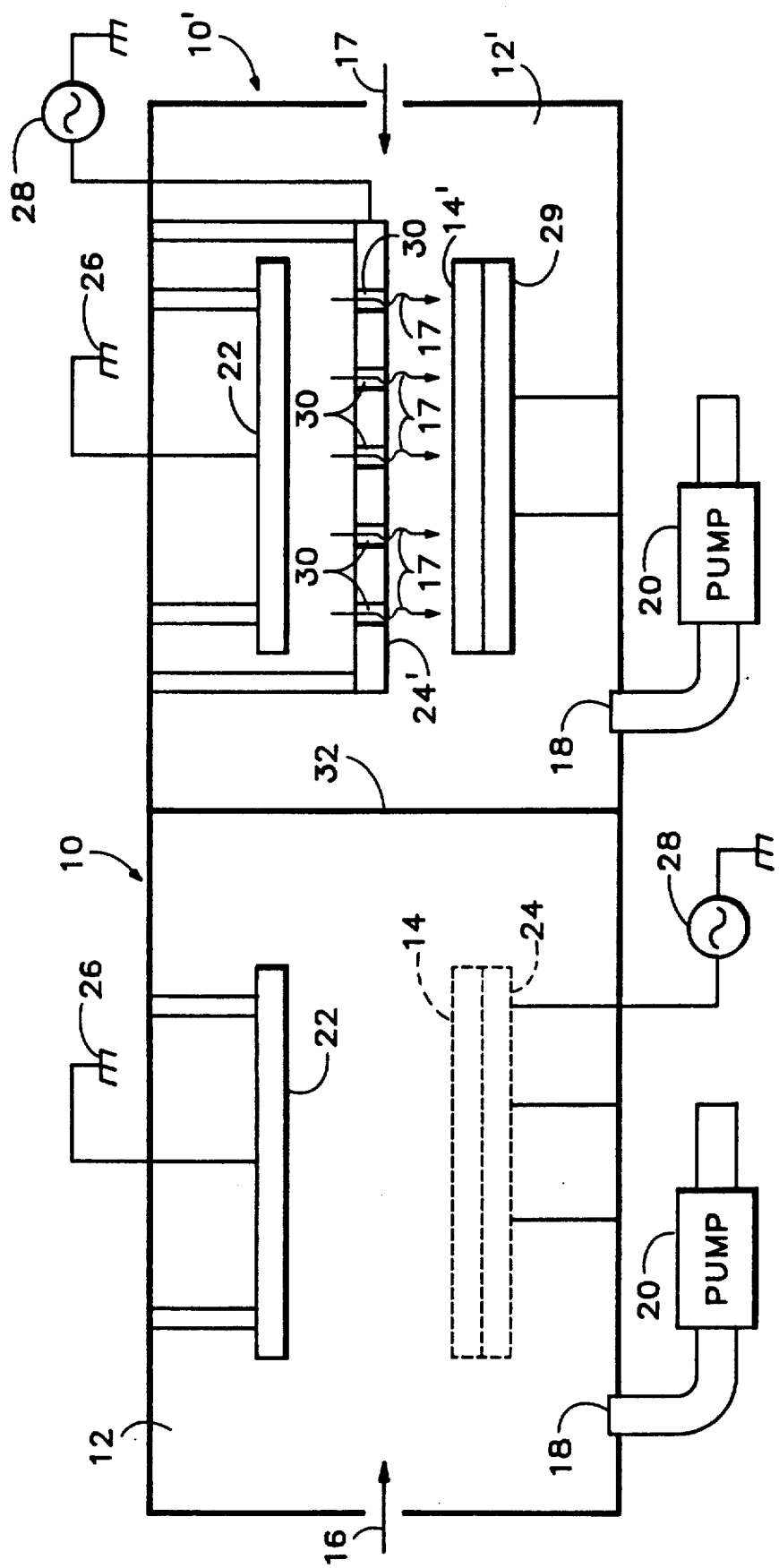
FIG. 2 is a pictorial representation of a multiple-compartment vacuum system which can be employed for conducting the dry etching process in one compartment and for conducting the non-reactive passivation process of the present invention in a second compartment.

In FIG. 2, a multiple-compartment gas plasma etching-passivating system comprising a first gas plasma etching system 10 for conducting etching operations and a second passivating system 10' for separately conducting passivating operations on a semiconductor device 14 is pictorially depicted. The gas plasma etching system 10 is the same configuration as in FIG. 1 which is described above in detail. The second passivating system 10' is integrally connected to etching system 10 and is separated by a common movable partition 32. System 10' includes a passivation chamber 12' in which a semiconductor device 14 is introduced after completion of the etching operation. During etching or passivating operations the partition 32 is in a closed position. However, when movement of the semiconductor device 14 is desired from chamber 12 of system 10 to chamber 12' of system 10', partition 32 is moved to an open position (after evacuating the etching gas thru exhaust system 18) and etched semiconductor device 14 is introduced into chamber 12' where it is placed onto a support 29 so that the subject passivation operation can be conducted thereon.

After the partition 32 is moved to a closed position, the silicon tetrafluoride passivating gas, under plasma conditions, introduced into passivation chamber 12' through a gas inlet, described by directional arrow 17, for use in the passivation operation of the semiconductor device 14. After the passivation operation is completed, the $SiF_4$ gas is again removed via exhaust system 18 and exhaust pump 20. The gas plasma passivating gas is formed between upper and lower plasma etching electrode plates 22 and 24, respectively. The upper plate 22 is grounded by a conventional grounding device 26. The lower plate 24 is connected to an RF Generator 28 which, under the influence of vacuum, creates a $SiF_4$ gas plasma passivating material. The gaseous silicon tetrafluoride under plasma conditions moves downward from between plates 22 and 24, thru openings 30 in plate 24, where it reacts with the reactive chemical compound on semiconductor 14 to inhibit same and form the product of the present invention, semiconductor 14'. Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:
1. An IC process of making, comprising:
   a) providing a semiconductor wafer, having an etching area comprising an exposed silicon dioxide surface, at least one expose metal line on the silicon dioxide surface, and an exposed photoresist surface that covers at least part of the top surface of the metal line;
   b) etching the wafer, in the etching area, using a compound containing bromine, the bromine reacting with the exposed surfaces of the photoresist layer, metal line, and silicon dioxide;
   c) completing the etching process, whereby the bromine superadjacent to exposed surfaces in the etching area; and
   d) exposing the bromine on the etching area surfaces to silicon tetrafluoride (SiF4), in an amount that replaces bromine, whereby the fluorine will not corrode the exposed etching area surfaces when exposed to moisture.

* * * * *